United States Patent
Kang (10) Patent No.: US 7,518,937 B2
(45) Date of Patent: Apr. 14, 2009

(54) PARALLEL BIT TEST CIRCUIT AND METHOD

(75) Inventor: Uk-Song Kang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 27 days.

(21) Appl. No.: 11/896,828

(22) Filed: Sep. 6, 2007

(65) Prior Publication Data
US 2008/0062788 A1 Mar. 13, 2008

(30) Foreign Application Priority Data
Sep. 7, 2006 (KR) ...................... 10-2006-0086008

(51) Int. Cl.
*G11C 11/00* (2006.01)
(52) U.S. Cl. .................................... 365/201; 365/233.5
(58) Field of Classification Search ................. 365/201, 365/233.5
See application file for complete search history.

(56) References Cited

U.S. PATENT DOCUMENTS

| | | | |
|---|---|---|---|
| 6,529,428 B2 | 3/2003 | Oh | |
| 6,671,787 B2 | 12/2003 | Kanda et al. | |
| 7,403,212 B2 * | 7/2008 | Schick et al. | 345/661 |
| 2002/0041533 A1 * | 4/2002 | Toda | 365/225.7 |
| 2002/0061050 A1 * | 5/2002 | Ozluturk et al. | 375/141 |
| 2002/0135683 A1 * | 9/2002 | Tamama et al. | 348/222 |
| 2003/0200339 A1 * | 10/2003 | Greenblat et al. | 709/250 |
| 2004/0052115 A1 | 3/2004 | Tauber et al. | |
| 2005/0195666 A1 | 9/2005 | Hong et al. | |

* cited by examiner

*Primary Examiner*—Michael T Tran
(74) *Attorney, Agent, or Firm*—Harness, Dickey & Pierce (57) ABSTRACT

A parallel bit test circuit for a semiconductor memory device may include a plurality of data compressors, a delay unit, and a bus width converter. The data compressors may receive data output from data lines, compress the data, and output the compressed data. The delay unit may receive a clock signal, and may generate (N−1) number of delayed clock signals from the clock signal when a burst length is a natural number equal to or more than 2. The bus width converter may receive the compressed data through M number of input terminals, divide the compressed data into N number of data sets, and serially output the N number of data sets through M/N number of output terminals in response to the clock signal and the (N−1) number of delayed clock signals, where M may be the number of bits of the data output from the data lines.

11 Claims, 12 Drawing Sheets

PARALLEL BIT TEST CIRCUIT AND METHOD

PRIORITY STATEMENT

This U.S. nonprovisional patent application claims the benefit of priority under 35 U.S.C. §119 to Korean Patent Application 10-2006-0086008 filed on Sep. 7, 2006, in the Korean Intellectual Property Office, the entire contents of which are incorporated herein in their entirety by reference.

BACKGROUND

1. Field

Example embodiments relate to semiconductor memory devices, and for example, to a parallel bit test circuit and/or method, which may solve a channel lack problem in a tester by reducing the number of output pins without increasing test time.

2. Description of Related Art

In a semiconductor memory device such as a Dynamic Random Access Memory (DRAM), data read and/or write operations should generally be performed with precision. In order to perform more precise data read and/or write operations fail cells should not exist within chips.

However, in a very highly integrated semiconductor memory device the number of cells integrated in one chip gradually increases and approaches tens of millions or more, and a possibility of an occurrence of fail cells may increase despite well-developed manufacturing processes. The fidelity of chips having fail cells may not be guaranteed unless a more precise test for chips is performed to sort out the chips including fail cells.

Issues in testing semiconductor memory devices may be largely classified into issues of the fidelity of the test and issues of test time. For example, issues of test time may be concerned with the cost of products. For example, issues of test time may be concerned with shortening a product development period of semiconductor memory devices, shortening a test time until a shipment of products, and/or improving an efficiency of production and/or a competition between manufacturers by performing testing at a higher speed for tens of thousands of cells so as to reduce the test time.

In general, if performing a test for each cell in order to sort out memory cells as a pass/fail within a semiconductor memory device, test time of a highly integrated or very highly integrated semiconductor memory device may be lengthened and/or a cost may increase.

Accordingly, a parallel bit test may be performed in order to reduce the test time.

In order to distinguish the pass/fail of chips of a wafer state, cell addresses processed as a fail in the chips may be decided in an Electro Die Sorting (EDS) step, and/or fail cells may be repaired. Accordingly, the parallel bit test may be useful.

For example, in the parallel bit test, the same data may be written to numerous cells and/or the data may be read by using an exclusive OR circuit. If the same data is read from the cells, a corresponding cell may be decided as a pass. If even one different data is read, a corresponding cell may be decided as a fail. Accordingly, the parallel bit test may shorten a test time.

A conventional parallel bit test will be described below referring to FIGS. 1 to 4.

Figure 1:
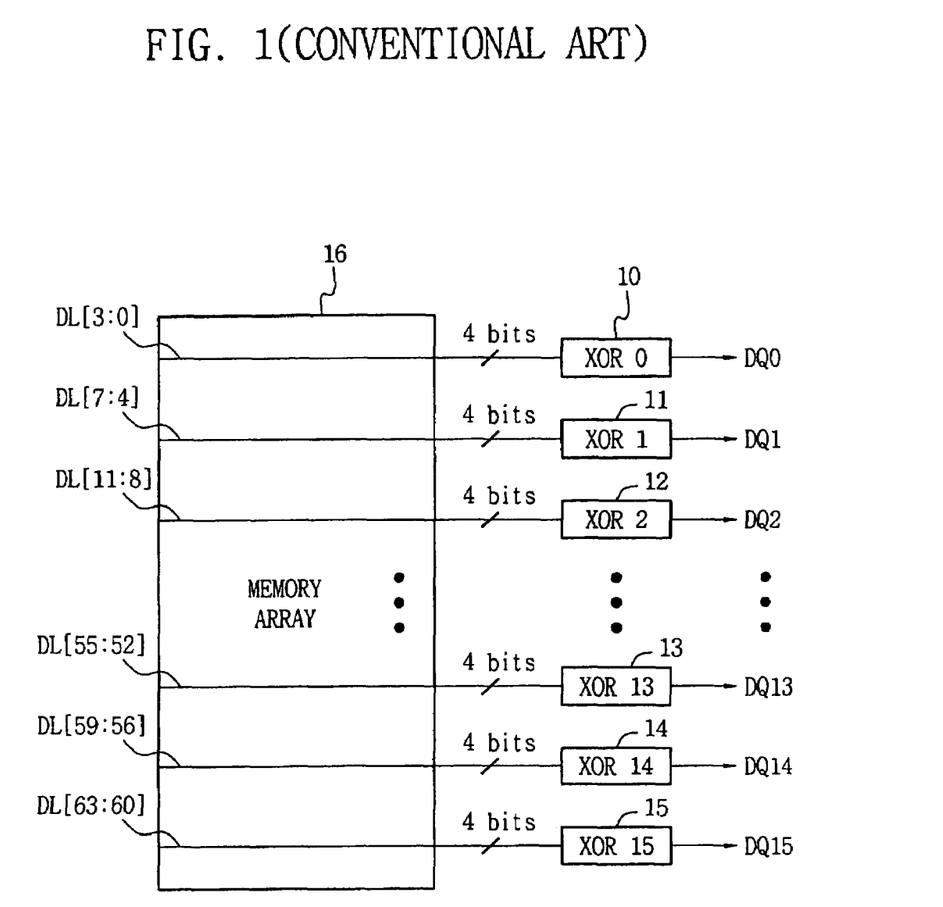
FIG. 1 is a block diagram of a conventional parallel bit test circuit for a semiconductor memory device.

FIG. 1 is a block diagram of a conventional parallel bit test circuit for use in a semiconductor memory device.

Referring to FIG. 1, the parallel bit test circuit may include a memory array 16 and a plurality of data compressors represented in FIG. 1 by data compressors 10 to 15. For example, the data compressors 10 to 15 in FIG. 1 may represent 16 data compressors of a parallel bit test circuit.

The memory array 16 may include a plurality of memory cells (not shown) arrayed in a matrix type. The plurality of memory cells may each be coupled to a corresponding data line.

The data compressors 10 to 15 may each include an exclusive OR circuit (XOR).

Figure 2:
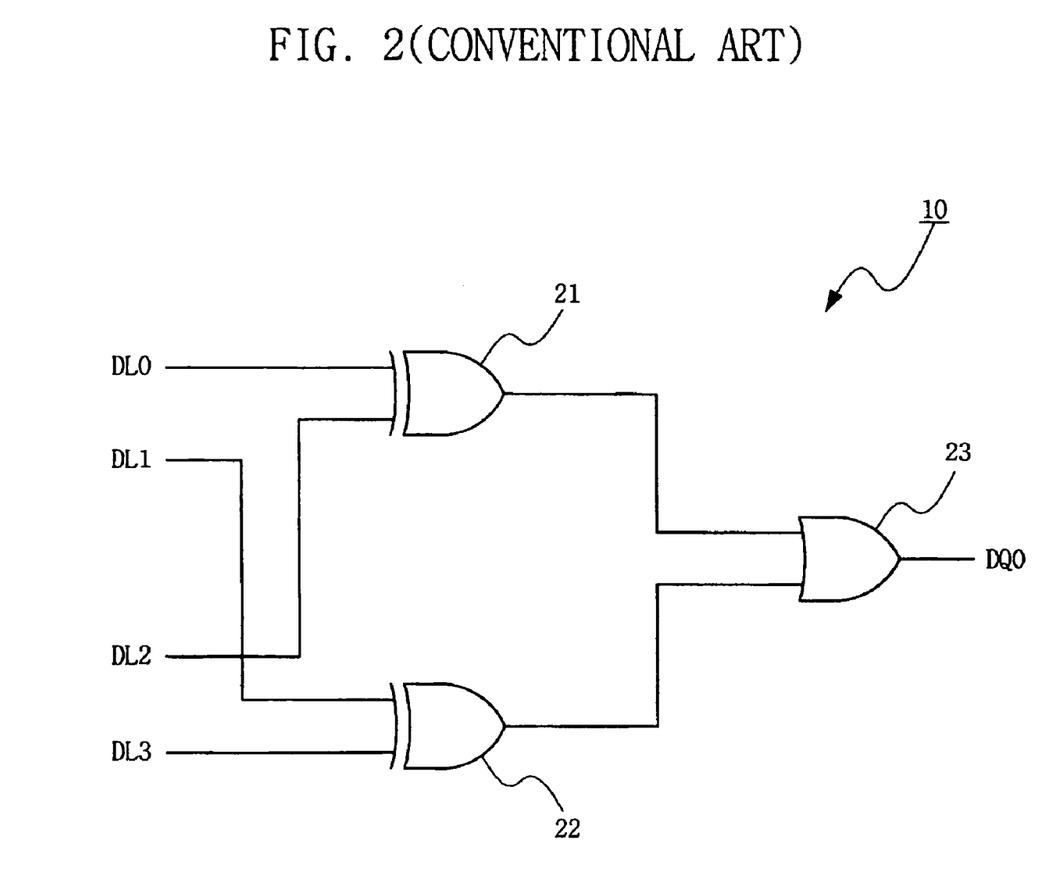
FIG. 2 is an example circuit diagram illustrating the data compressor of FIG. 1.

FIG. 2 provides an illustration of the data compressor 10 of FIG. 1 including the XOR circuit.

Referring to FIG. 2, if read data is applied to exclusive OR circuits 21 and 22 connected with data lines DL0, DL1, DL2 and DL3, the XOR 21 performs an XOR operation for data output from the data lines DL0 and DL2, and the XOR circuit 22 may perform an XOR operation for data output from the data lines DL1 and DL3. An OR circuit 23 receives an XOR operation result of the XOR circuits 21 and 22, and performs an OR operation. The OR circuit 23 outputs the result of the OR operation to an output pin DQ0. Data compressors 11 to 15 may be the same as the data compressor 10 in FIG. 2.

Referring back to FIG. 1, if one word line (not shown) is activated, data bits of 4×16 are read at once. The plurality of data lines coupled to each of the respective data compressors 10 to 15 may be four.

Accordingly, each of the data compressors 10 to 15 may compress data of 4 bits into 1 bit.

For example, if data is applied to data lines DL[3:0], if even one data is different therefrom, the data compressor 10 may output a logic '1' to an output pin DQ0. If data applied to the data lines DL[3:0] are all the same, the data compressor 10 may output a logic '0' to output pin DQ0.

If a burst length is 1, output pins used in the parallel bit test may be DQ0~DQ15 as described above. However, if the burst length is 2, the number of output pins used in the parallel bit test may be reduced in half, though not shown in FIG. 1. For example, if the burst length is 2, output pins used in the parallel bit test may be DQ0, DQ2, DQ4, DQ6, DQ8, DQ10, DQ12 and DQ14.

The burst length may indicate the number of successive data within one clock cycle. For example, if a burst length is 1, data may be sampled only at a rising edge of clock signal, and if the burst length is 2, data may be sampled at a rising edge and a falling edge of the clock signal. For example, a burst length of 2 for a parallel bit test will be described below referring to FIG. 4.

Figure 4:
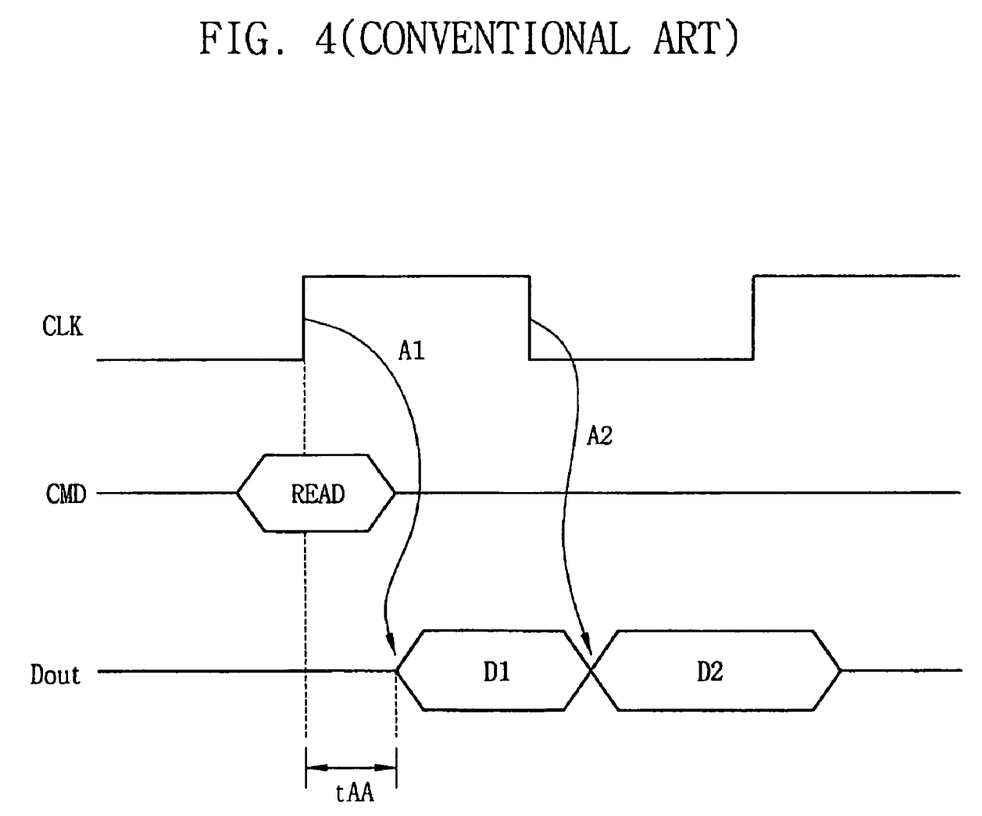
FIG. 4 illustrates an example timing diagram for a burst length of 2 for the conventional parallel bit test circuit.

FIG. 4 illustrates an example timing diagram provided if a burst length is 2. Referring to FIG. 4, if a read command READ is applied to a semiconductor memory device synchronized to a rising edge of clock signal CLK, data D1 may be output to an output pin DQ, and successive data D2 may be output to the output pin. For example, the data D1 may be output in response to the rising edge A1 of the clock signal CLK, and the data D2 may be output in response to a falling edge A2 of the clock signal CLK.

Figure 3:
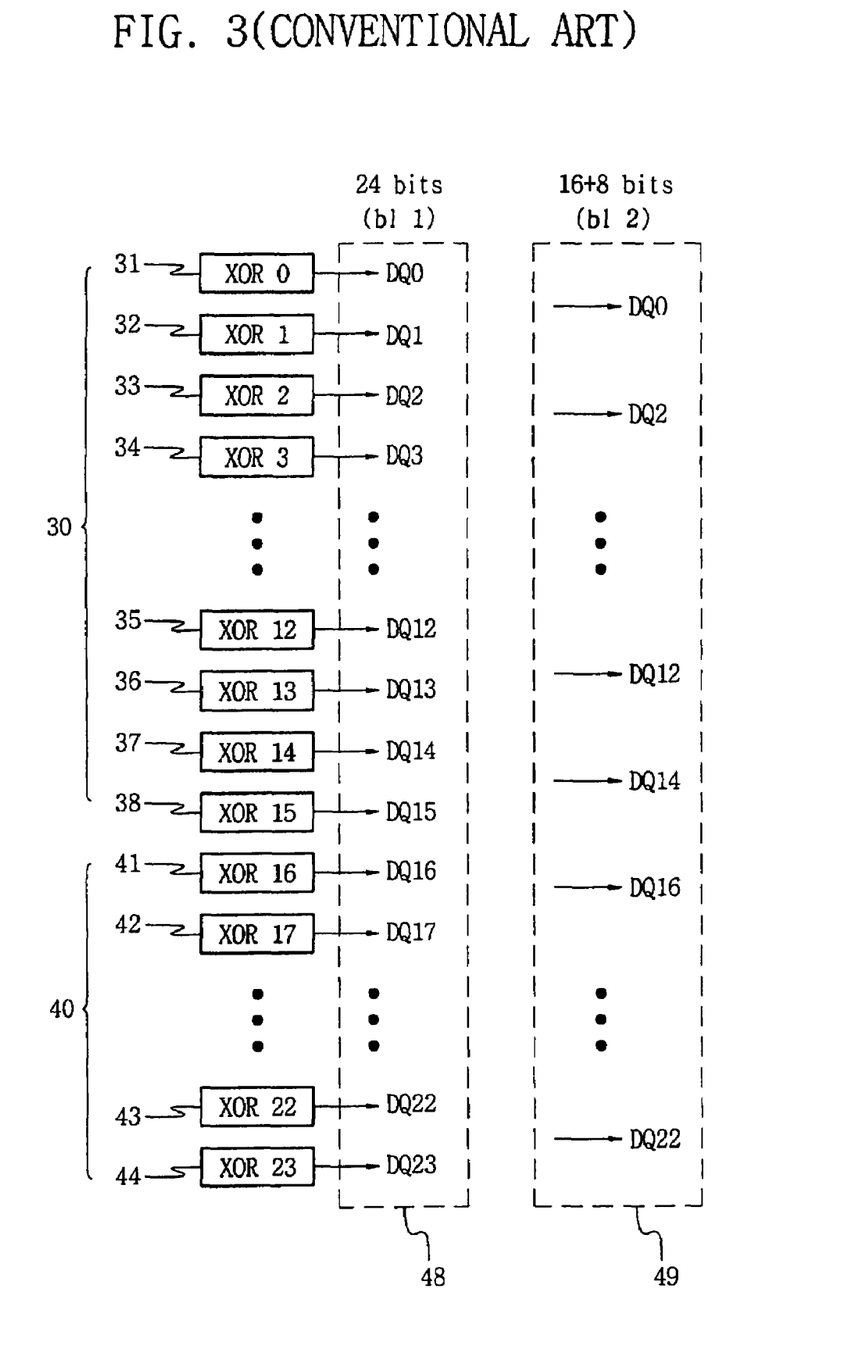
FIG. 3 is a block diagram for a conventional parallel bit test provided if the size of a memory array increases by 50% through addition of a parity cell area for error correction.

FIG. 3 is a block diagram for a parallel bit test provided if the size of a memory array increases by 50% by adding a parity cell area for an error correction to the memory array area of FIG. 1.

Referring to FIG. 3, the parallel bit test circuit may include data compressors 31 to 44 and output pins DQ0 to DQ23.

The data compressors 31 to 44 may be classified into two groups 30 and 40. A first group 30 may correspond to the data compressors shown in FIG. 1 and a second group 40 may be for data compressors for parity bits.

Bits not parity bits for error correction will be referred to as normal bits, the number of data lines coupled to a data compressor may be four and the number of data lines of the normal bit area may be 64. The number of data lines of the parity bit area may be 32. Accordingly, in this case a parity bit overhead may be 50%.

Accordingly, the number of the parity bit data compressors may be 8, and the number of the normal bit data compressors may be 16. The total number of data compressors may be 24.

As shown by reference number 48, a total of 96 data bits may be output simultaneously. Accordingly, in order to perform a parallel bit test with a burst length of 1 as shown by reference number 48, the number of output pins may be 24. As shown in a reference number 49, even for a burst length of 2, at least 16 output pins may be required.

Consequently, the number of chips simultaneously testable in one tester may be reduced, causing an increase in test time.

Accordingly, if a memory capacity increases, the number of input/output lines may increase, and parity bits for an error correction may be added.

SUMMARY

Example embodiments may provide a parallel bit test circuit and/or parallel bit test method, capable of solving a test time increase problem caused by reducing the number of chips simultaneously testable in one tester. In the circuit and/or method, a test time increase of a parallel bit test may be controlled, the test time increase being caused if a memory capacity relatively increases and/or the number of input/output lines relatively increases in a semiconductor memory device. A test time increase may be reduced in performing a parallel bit test if parity bits for an error correction are added in a semiconductor memory device.

According to an example embodiment, a parallel bit test circuit for a semiconductor memory device having a memory cell array in which a plurality of memory cells connected to a plurality of data lines are arrayed in a matrix may include a plurality of data compressors, a delay unit, and a bus width converter. Each of the plurality of data compressors may be coupled with a given number of data lines, and the plurality of data compressors may receive data output from the data lines, compress the data, and output the compressed data. The delay unit may receive a clock signal, and may generate (N−1) number of delayed clock signals from the clock signal when a burst length is a natural number equal to or more than 2. The bus width converter may receive the compressed data through M number of input terminals, divide the compressed data into N number of data sets, and sequentially and serially output the N number of data sets through M/N number of output terminals in response to the clock signal and the (N−1) number of delayed clock signals, where M may be the number of bits of the data output from the data lines.

According to an example embodiment, the burst length may be controlled by a burst length control signal.

According to an example embodiment, the semiconductor memory device may be a Double Data Rate Synchronous Dynamic Random Access Memory (DDR SDRAM).

According to an example embodiment, the data lately output within each cycle of the clock signal may be data of a parity bit area for an error correction.

According to an example embodiment, the bus width converter may include M number of multiplexers configured to receive the compressed data, N number of D flip-flops connected to the M number of multiplexers, and an OR gate configured to receive the clock signal and the (N−1) number of delayed clock signal and perform a logical OR operation on the clock signal and the (N−1) number of delayed clock signal. The M number of multiplexers and the M number of D flip-flops may be arranged in N number of stages. When a storage signal applied to the M number of D flip-flops is enabled, the compressed data may be loaded from the M number of multiplexers into the M number of D flip-flops. Then, when the storage signal is disabled, in response to the clock signal and the (N−1) number of delayed clock signals, the D flip-flops in each of first to (N−1)-th stages may output the loaded compressed data to corresponding multiplexers in the next stage and the D flip-flops in an N-th stage may output the loaded compressed data through the M/N number of output terminals.

According to an example embodiment, the delay unit may be any one of an inverter chain circuit, a phase locked loop circuit, and a delay locked loop circuit.

According to an example embodiment, a parallel bit test method for a semiconductor memory device having a memory cell array in which a plurality of memory cells connected to a plurality of data lines are arrayed in a matrix may include compressing data from the plurality of data lines and outputting the compressed data; when a burst length is a natural number N equal to or more than 2, generating (N−1) number of delayed clock signals from a clock signal; and converting the compressed data into output data having a width smaller than that of the compressed data on the basis of the burst length in response to the clock signal and the (N−1) number of delayed clock signal.

According to an example embodiment, the semiconductor memory device may be a Double Data Rate Synchronous Dynamic Random Access Memory (DDR SDRAM).

According to an example embodiment, the burst length may be controlled by a burst length control signal.

According to an example embodiment, the converting the compressed data may include dividing the compressed data into N number of data sets, where N may be the same as the burst length; and sequentially and serially outputting the N number of data sets in response to the clock signal and the (N−1) number of delayed clock signals.

According to an example embodiment, the data set lastly output within each cycle of the clock signal may be data of a parity bit area for an error correction.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Example embodiments will now be described more fully hereinafter with reference to the accompanying drawings. Embodiments may, however, be embodied in many different forms and should not be construed as limited to the example embodiments set forth herein. Rather these example embodiments are provided so that this disclosure will be thorough and complete, and will fully convey the scope to those skilled in the art. In the drawings the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 5:
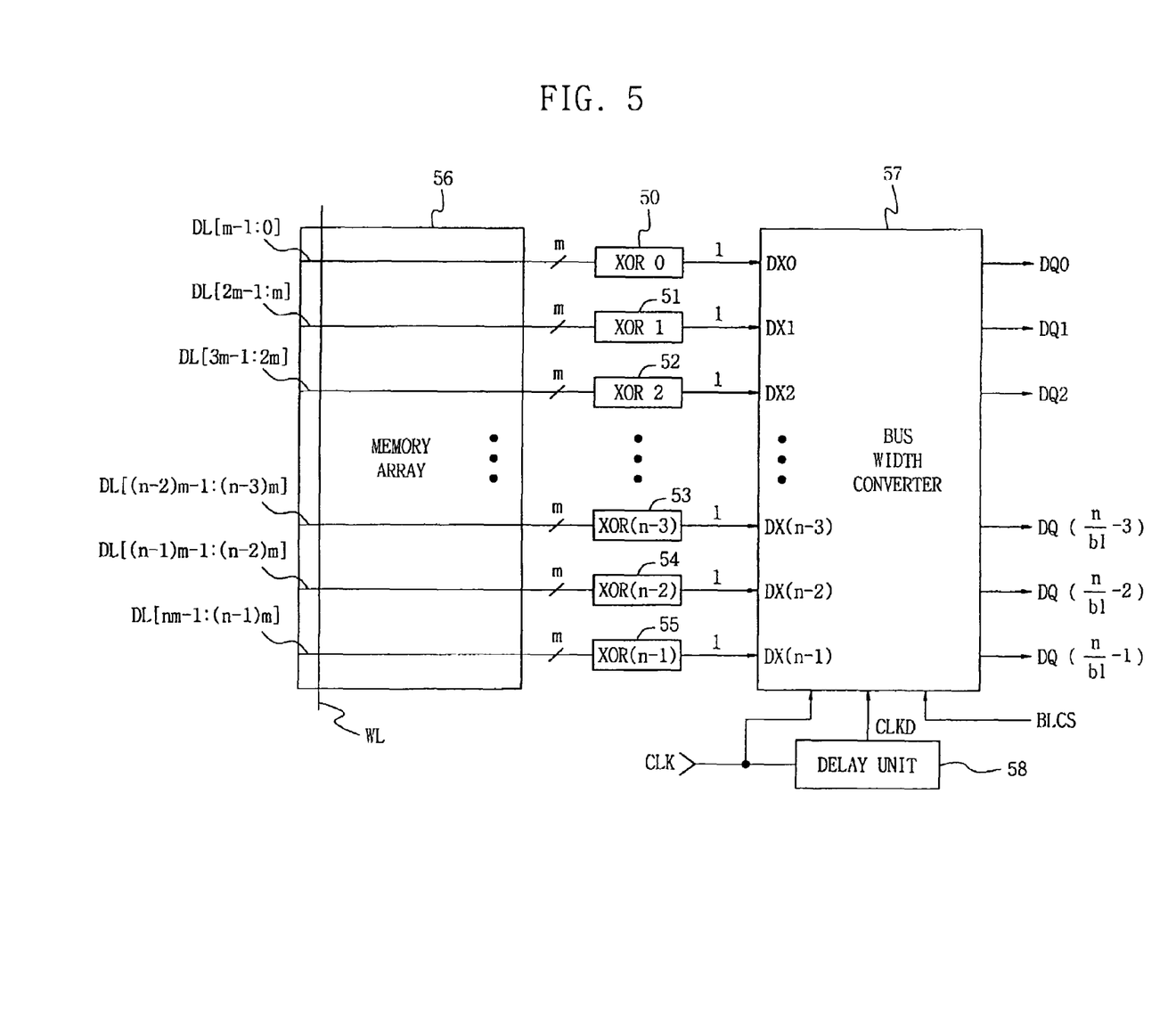
FIG. 5 is a block diagram of a parallel bit test circuit for a semiconductor memory device according to an example embodiment.

FIG. 5 is a block diagram of a parallel bit test circuit including a bus width converter for use in a semiconductor memory device according to example embodiments.

FIG. 5 illustrates a parallel bit test circuit for use in a semiconductor memory device having a memory array in which a plurality of memory cells may be arrayed in a matrix type. Referring to FIG. 5, the parallel bit test circuit of a semiconductor memory device may include a plurality of data compressors 50 to 55, a delay unit 58 and/or a bus width converter 57.

The data compressors 50 to 55 may be respectively connected with a plurality of data lines DL[m−1:0], DL[2m−1:m], DL[3m−1:2 m], . . . , DL[(n−2)m−1:(n−3)m], DL[(n−1)m−1:(n−2)m and DL[nm−1:(n−1)m], wherein m and n may be natural numbers and/or may be under a condition of m≦n. The plurality of data lines may be coupled with the memory cells (not shown). The data compressors 50 to 55 may receive data output from the data lines DL[m−1:0], DL[2m−1:m], DL[3m−1:2 m], . . . , DL[(n−2)m−1:(n−3)m], DL[(n−1)m−1:(n−2)m and DL[nm−1:(n−1)m], compress the data, and/or output the compressed data to the bus width converter 57.

Each of the data compressors 50 to 55 may receive data output from a desired, or alternatively, a given number of data lines, compress the data into one data, and/or apply the compressed data to data input terminal DX0~DX(n−1) of the bus width converter 57.

For example, if 'm=4, n=24', four data may be applied to each data compressor. Each data compressor 50 to 55 may receive four data, perform a series of logical operations including an exclusive OR operation, and/or apply the result of the operations to input terminal DX0~DX(n—1) of the bus width converter 57. Each data compressor 50 to 55 may be constructed of a first XOR circuit 21, a second XOR circuit 22, and/or an OR circuit 23 as in the afore-described illustration of FIG. 2. However, example embodiments are not limited thereto, and data lines coupled to one data compressor may be more than four or less than four.

The delay unit 58 may receive a clock signal and/or generate a delayed clock signal. The delay unit 58 may generate at least one delayed clock signal. An example circuit diagram illustrating the delay unit 58 is provided in FIG. 8, and a detailed description thereof is provided below with reference to FIG. 8.

Returning to FIG. 5, the bus width converter 57 may convert a width of the compressed data output from the data compressors 50 to 55 into a width smaller than that of the compressed data in response to the clock signal and delayed clock signal, and/or output the converted data to an output terminal DQ0~DQ(n/bl−1). A burst length bl may be controlled by a burst length control signal BLCS. For example, the bus width converter 57 may receive compressed data having a width n from the data compressors 50 to 55. Accordingly, if the burst length bl is 1, n number of output pins may be needed, and if the burst length bl is 2, n/2 number of output pins may be needed, and if the burst length bl is 3, n/3 number of output pins may be required. For example, parallel data may have a width of n, e.g., width n may be the number of parallel data lines required to transmit the parallel data, and/or the bus width converter may convert the parallel data having a width of n to data having a width n/bl. For example, the data converted by the bus width converter 57 may require a smaller number of parallel data lines for transmission.

The bus width converter 57 may output at least three successive data to an output terminal within one clock cycle of the clock signal CLK. For example, each output terminal DQ0~DQ(n/bl−1) may output serial data of at least three bits corresponding to a portion of the compressed data having the width n. For example, the bus width converter 57 may convert data at a ratio of at least n:n/3 using the clock signal CLK, the delayed clock signal DCLK, and the burst length bl of 3. However, example embodiments are not limited to the above, and the bus width converter 57 may output any number of successive data to the output terminal within one clock cycle of the clock signal CLK.

If the bus width converter 57 outputs three successive data to the output terminal within one clock cycle of the clock signal CLK, the delay unit 58 may generate one delayed clock signal CLKD. The last data of the three successive data may be data of a parity bit area for an error correction, and/or the data of the parity bit area for the error correction may be sampled at a falling edge of the delayed clock signal CLKD.

If the bus width converter 57 outputs four successive data to the output terminal within one clock cycle of the clock signal CLK, the delay unit 58 may generate two delayed clock signals. The last data of the four successive data may be data of a parity bit area for an error correction, and/or the data of the parity bit area for the error correction may be sampled at a falling edge of a clock signal further delayed from among the two delayed clock signals.

However, example embodiments are not limited to the above, and the bus width converter 57 may output any number of successive data to the output terminal within one clock cycle of the clock signal CLK, and the delay unit 58 may generate any number of delayed clock signals. For example, the last data of the number of successive data may be data of a parity bit area for error correction, and/or the data of the parity bit area for the error correction may be sampled at a falling edge of a clock signal further delayed from among the number of delayed clock signals.

Figure 6:
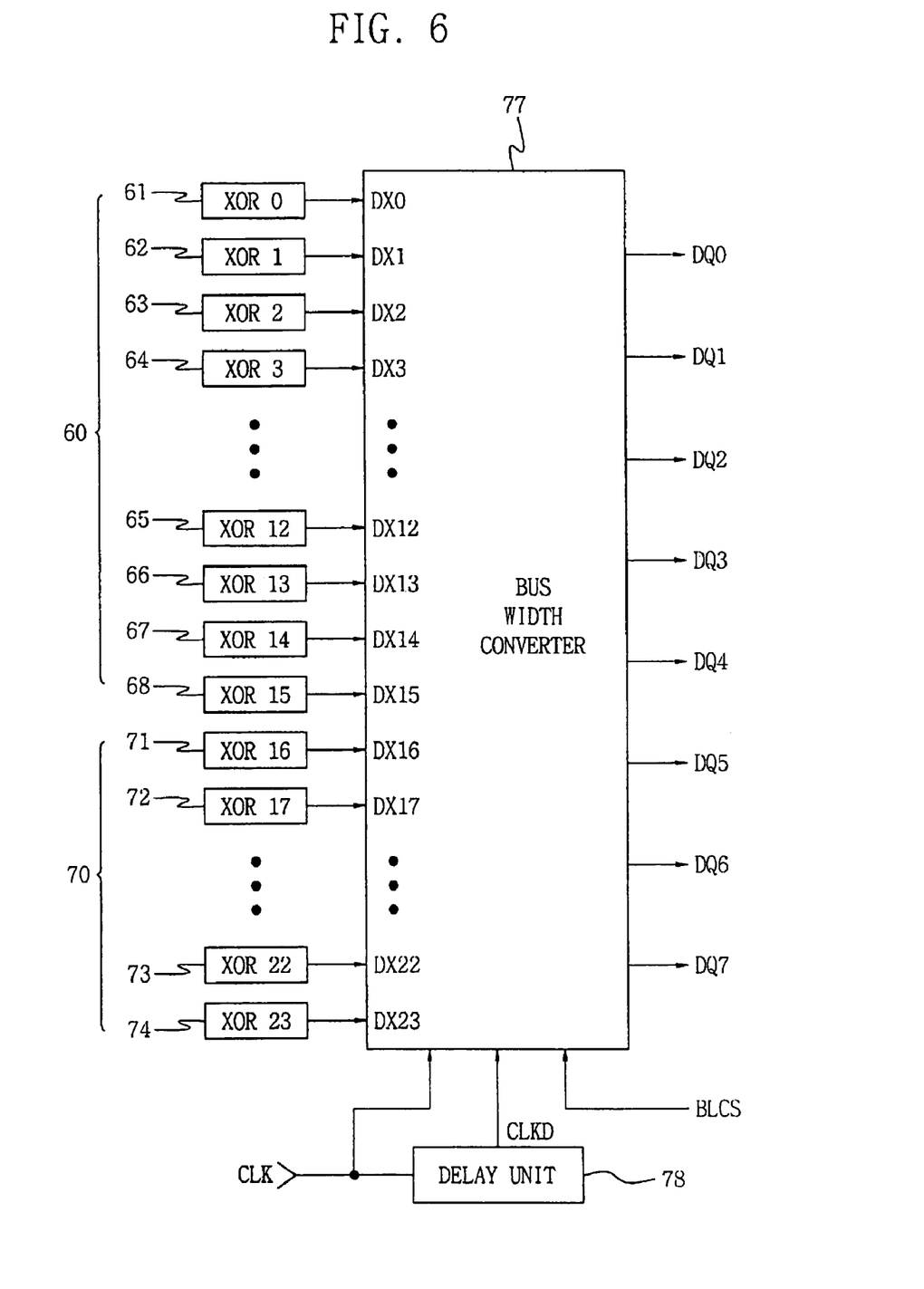
FIG. 6 is a block diagram illustrating 24 bits of data output from the data compressors and a burst length of 3 in FIG. 5.
Figure 7:
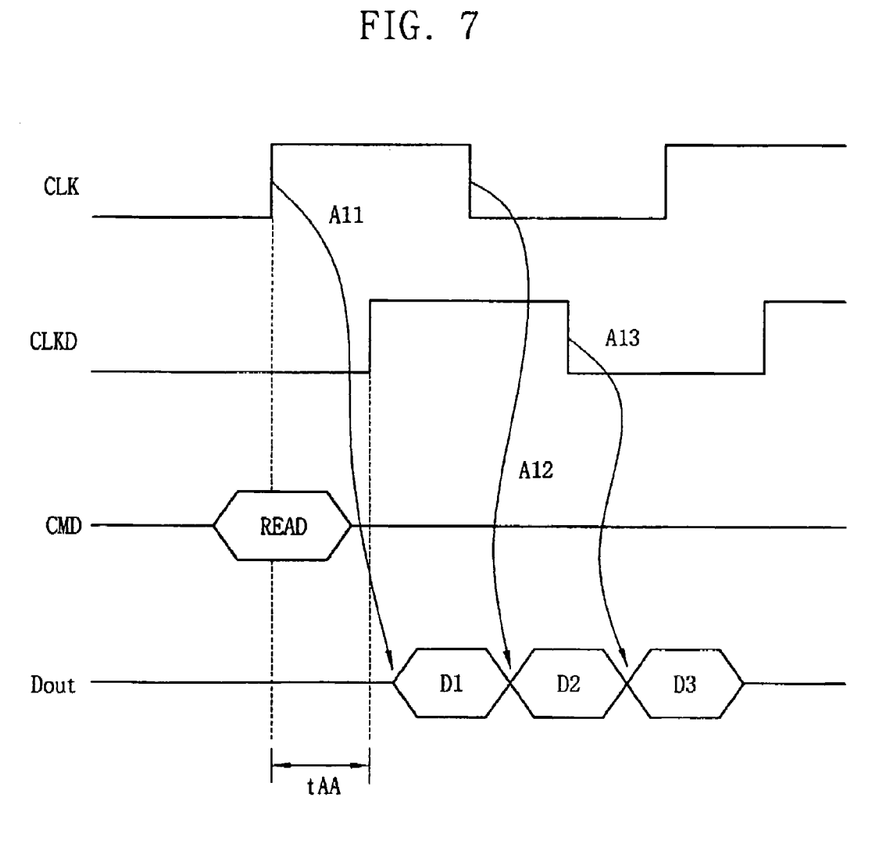
FIG. 7 illustrates example timing diagrams for the example embodiment of FIG. 6 assuming a burst length of 3.

FIG. 6 provides an illustration of a bus width converter 77 and FIG. 7 provides an example timing diagram for outputs of three successive data to an output terminal within one clock cycle of the clock signal CLK for an example embodiment in FIG. 6.

FIG. 6 is a block diagram illustrating n=24 and a burst length of 3 in an example embodiment in FIG. 5, and FIG. 7 illustrates example timing diagrams illustrating a burst length of 3 in an example embodiment in FIG. 6.

Referring to FIG. 6, compressed data of 24 bits output from data compressors 61 to 68 and 71 to 74 may be input to input terminal DX0 to DX23 of the bus width converter 77. Data compressors 61 to 68 may correspond to a first group 60 and/or data compressors 71 to 74 may correspond to a second group 70. The burst length may be 3, and/or bus width converter 77 may output data of 8 bits to output terminal DQ0~DQ7 in response to clock signal CLK and/or a delayed clock signal CLKD generated in the delay unit 78. In this case, the burst length control signal BLCS may control the burst length to, for example, 3.

Referring to FIGS. 6 and 7, the bus width converter 77 may output first data D1 to the output terminals DQ0~DQ7 in response to a rising edge A11 of the clock signal CLK, output second data D2 consecutive to the first data D1 to the output terminals DQ0~DQ7 in response to a falling edge A12 of the clock signal CLK, and/or output third data D3 consecutive to the second data D2 to the output terminals DQ0~DQ7 in response to a falling edge A13 of the delayed clock signal CLKD generated in the delay unit 78. The first, second and/or third data D1, D2 and/or D3 may each be 8 bits. If the memory array of the semiconductor memory device has a plurality of memory cells including parity bits for an error correction, the third data D3 may be data of a parity bit area for the error correction.

However, according to example embodiments, if a burst length is 3, data may be divided into 8+8+8 bits, and/or the bit number of output data may be 8 bits. Accordingly, the number of required output pins may be reduced to 8. For example, the number of chips to be simultaneously tested in one tester may increase as compared to the conventional art and/or the increase of test time may be controlled.

In example embodiments a burst length may be 4 or more. For example, if the burst length is 4, data may be divided into 6+6+6+6 bits, and a required number of output pins may be reduced to 6. For example, if a burst length is X, data of Y bits may be divided, and a required number of output pins may be reduced to Y/X.

As described above, the bus width converter 57 may convert a width of the compressed data controlled and/or applied by burst length control signal BLCS into a width smaller than that of the compressed data, and/or may output the data to the output terminal DQ0~DQ(n/bl−1). Accordingly, if there is a capacity increase of a semiconductor memory device and/or an increase in the number of input/output lines, for example, if parity bits for an error correction are added, test time increase may be reduced for the parallel bit test.

The semiconductor memory device may be a Double Data Rate Synchronous Dynamic Random Access Memory (DDR SDRAM). In the DDR SDRAM, if the burst length is 3, data may be sampled at all of a rising edge and a falling edge of clock signal and a falling edge of a delayed clock signal.

Figure 8:
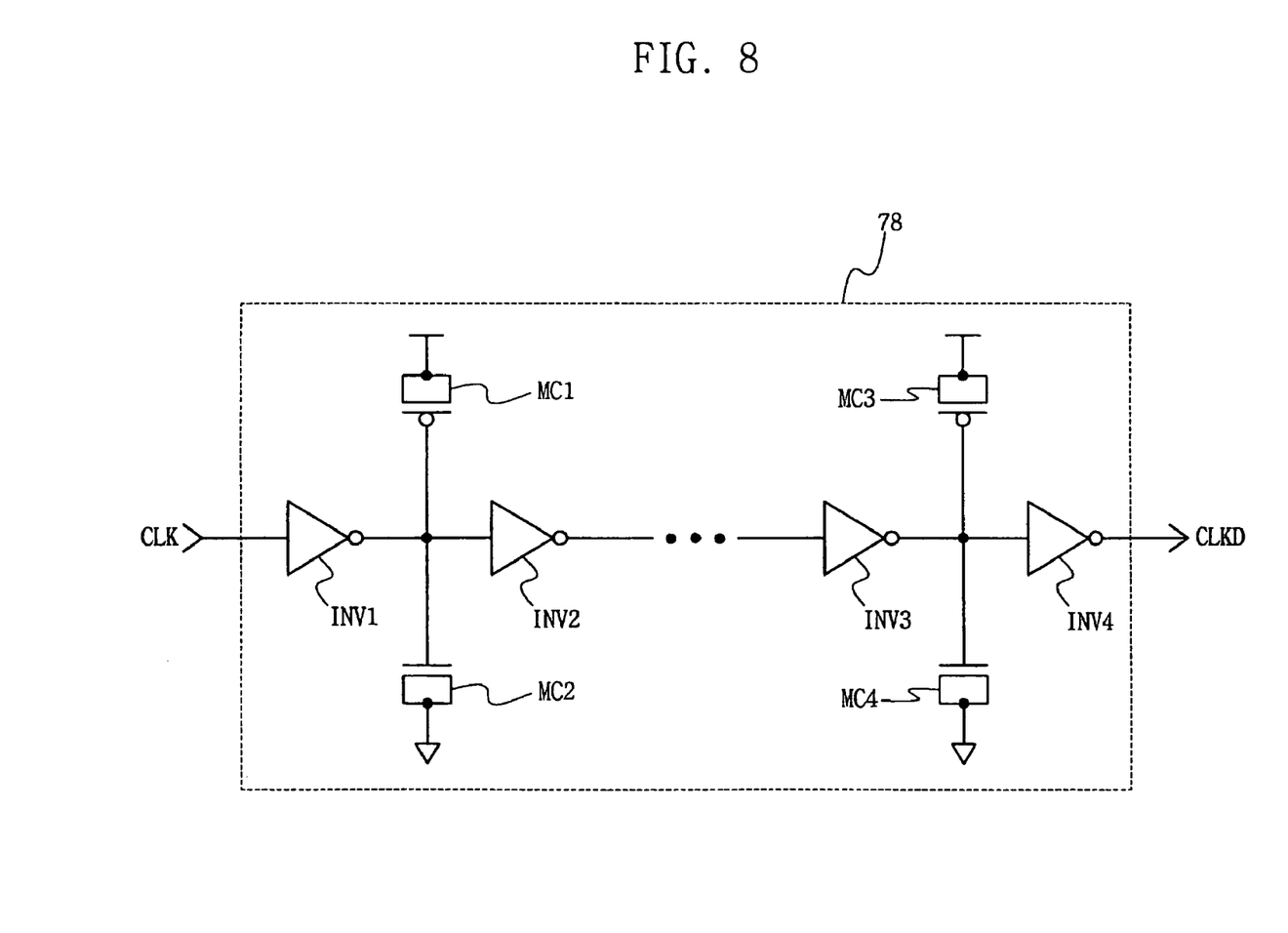
FIG. 8 is a circuit diagram illustrating an example of the delay unit shown in FIG. 6.

FIG. 8 is an example circuit diagram illustrating an example of the delay unit 78 shown in FIG. 6.

Referring to FIG. 8, the delay unit 78 may include an inverter chain having a plurality of inverters INV1, INV2, . . . , INV3 and/or INV4. In order to increase a delay effect, each output terminal of the inverters INV1, INV2, . . . , INV3 may be provided with one pair of MOS capacitors, for example, an output terminal of INV1 with MC1 and MC2, and an output terminal of INV3 with MC3 and MC4. The delay unit 78 may receive the clock signal CLK and/or generate a delayed clock signal CLKD. If there are multiple delayed clock signals CLKD to be generated, an output signal, e.g., output signal of INV2, provided in the medium of the inverter chain, may be used, and other inverters may be added to the inverter chain.

The delay unit 78 may be an inverter chain as shown in FIG. 8, but may be a general Phase Locked Loop (PLL) circuit or Delay Locked Loop (DLL) circuit. A phase change through the PLL or DLL circuit is well known to those skilled in the art, and a detailed description thereof will be omitted.

A parallel bit test method for use in a semiconductor memory device according to example embodiments is described below referring to FIGS. 5 to 8.

A parallel bit test method for use in a semiconductor memory device having a memory array 56 in which a plurality of memory cells may be arrayed in a matrix type, may include compressing data, generating at least one delayed clock signal, and/or converting a bus width according to example embodiments.

The data compression may include receiving data output from a plurality of data lines DL[m−1:0], DL[2−1:m], DL[3m−1:2 m], . . . , DL[(n−2)m−1:(n−3)m], DL[(n−1)m−1:(n−2)m and DL[nm−1:(n−1)m] that may be connected with the memory cells and compressing the data. The data may be compressed by a plurality of data compressors represented by data compressors 50 to 55.

The delayed clock signal generation may generate at least one delayed clock signal CLKD from the clock signal CLK. For example, the delayed clock signal CLKD may be generated by the delay unit 58.

The bus width conversion may convert the data compressed in the data compression into a width smaller than that of the compressed data in response to the clock signal CLK and the delayed clock signal CLKD. For example, the bus width conversion may be performed by the bus width converter 57.

The bus width conversion may be controlled by a burst length control signal BLCS, and may convert the compressed data into a width less than that of the compressed data. For example, the bus width converter 57 may be controlled by the burst length control signal BLCS, and may convert the compressed data into a width less than that of the compressed data. For example the burst length may be 3, however, example embodiments are not limited thereto.

For example, the bus width conversion may include outputting first data D1 to the output terminals DQ0~DQ7 in response to a rising edge A11 of the clock signal CLK, outputting second data D2 consecutive to the first data D1 to the output terminals DQ0~DQ7 in response to a falling edge A12 of the clock signal CLK, and/or outputting third data D3 consecutive to the second data D2 to the output terminals DQ0~DQ7 in response to a falling edge A13 of the delayed clock signal CLKD.

If the memory array of the semiconductor memory device has a plurality of memory cells including parity bits for an error correction, the third data D3 may be data of a parity bit area for the error correction.

As in the parallel bit test circuit of example embodiments, the delayed clock signals may be multiple delayed clock signals and/or the burst length may be 4 or more.

A bus width converter according to example embodiments is described below in detail with reference to FIGS. 9-12.

Figure 9:
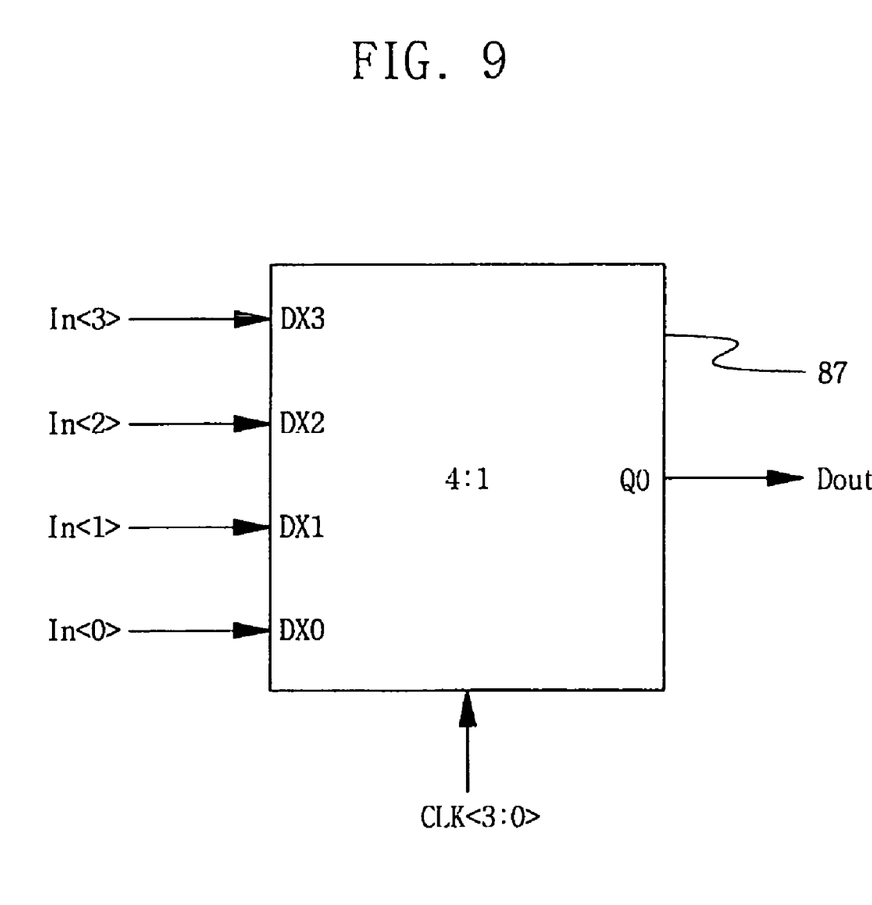
FIG. 9 is a block diagram of a bus width converter for 'n=4' and 4 of a burst length.
Figure 10:
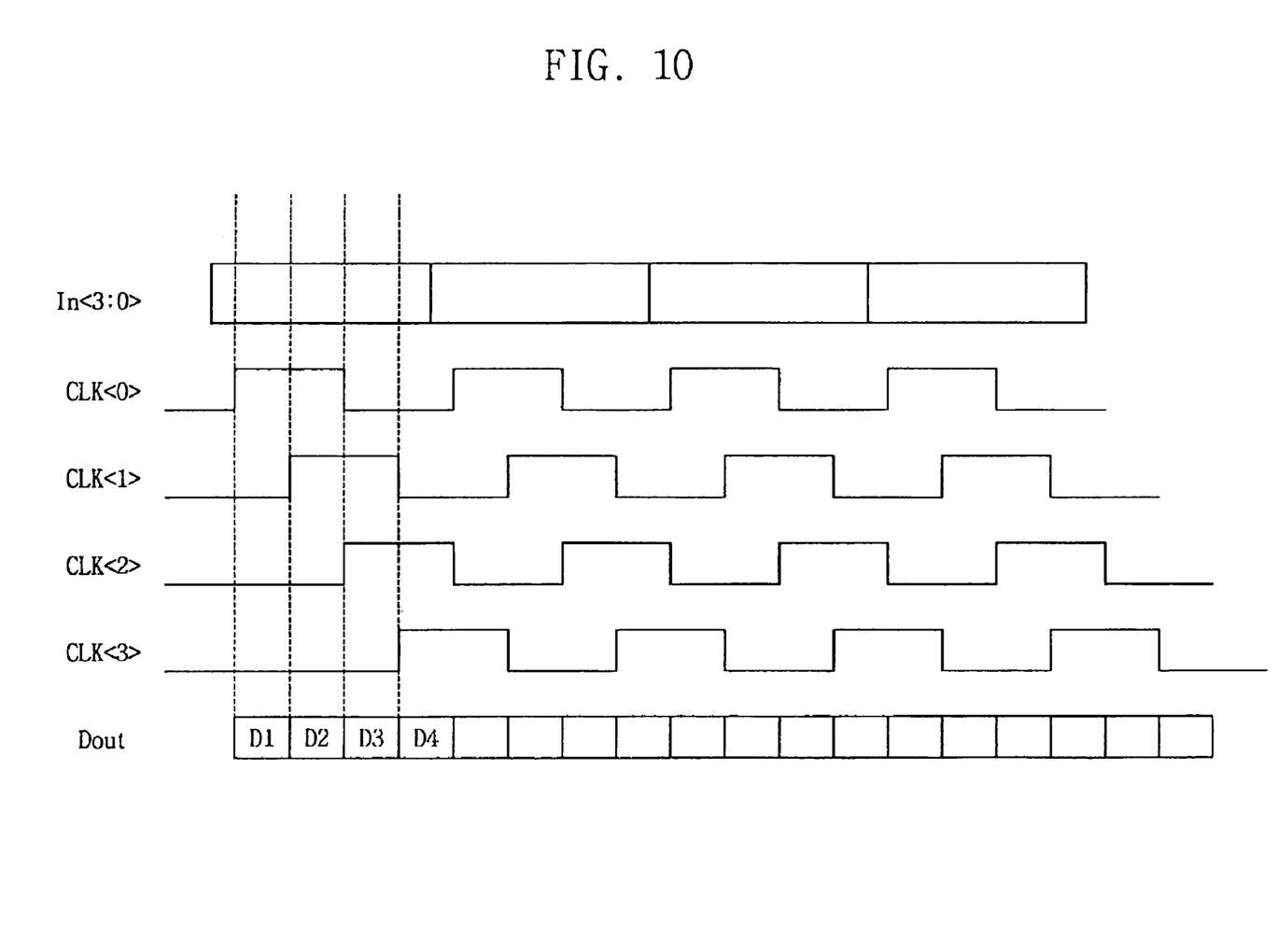
FIG. 10 illustrates an example timing diagram for operation of the bus width converter shown in FIG. 9.

FIG. 9 is a block diagram of bus width converter 87 for 'n=4' and 4 of a burst length, for example with an example of data converted at a ratio of 4:1 by using a quad data rate clock. FIG. 10 illustrates example timing diagrams for an operation of the bus width converter of FIG. 9.

Referring to FIGS. 9 and 10, the bus width converter 87 may be provided to output four successive data within one clock cycle of clock signal CLK, to output terminal Q0. For example, the bus width converter 87 may be configured to receive data In<3:0> through input terminal DX0, DX1, DX2, DX3 and to have an output controlled by zeroth to third clocks CLK<3:0> with different phases.

The bus width converter 87 may output data In<0> input to zeroth input terminal DX0, as a first data D1, in response to a rising edge of the zeroth clock CLK<0>, and/or output data In<1> input to first input terminal DX1, as a second data D2, in response to a rising edge of the first clock CLK<1>. The bus width converter 87 may output data In <2> input to second input terminal DX2, as a third data D3, in response to a rising edge of the second clock CLK<2>, and/or output data In<3> input to third input terminal DX3, as a fourth data D4, in response to a rising edge of the third clock CLK<3>. For example, the bus width converter 87 may receive parallel data In<3:0> of lower speed, convert the parallel data In<3:0> of lower speed into serial data D1, D2, D3, D4 of higher speed, and/or output the serial data D1, D2, D3, D4 as output data Dout. The first clock signal CLK<1> may be a delay signal of the zeroth clock signal, the second clock signal CLK<2> may be an inverted signal of the zeroth clock signal CLK<0>, and/or the third clock signal CLK<3> may be an inverted signal of the first clock signal CLK<1>. However, example embodiments are not limited thereto and a bus width converter may be configured to convert any width of parallel data of lower speed into serial data of higher speed.

Figure 11:
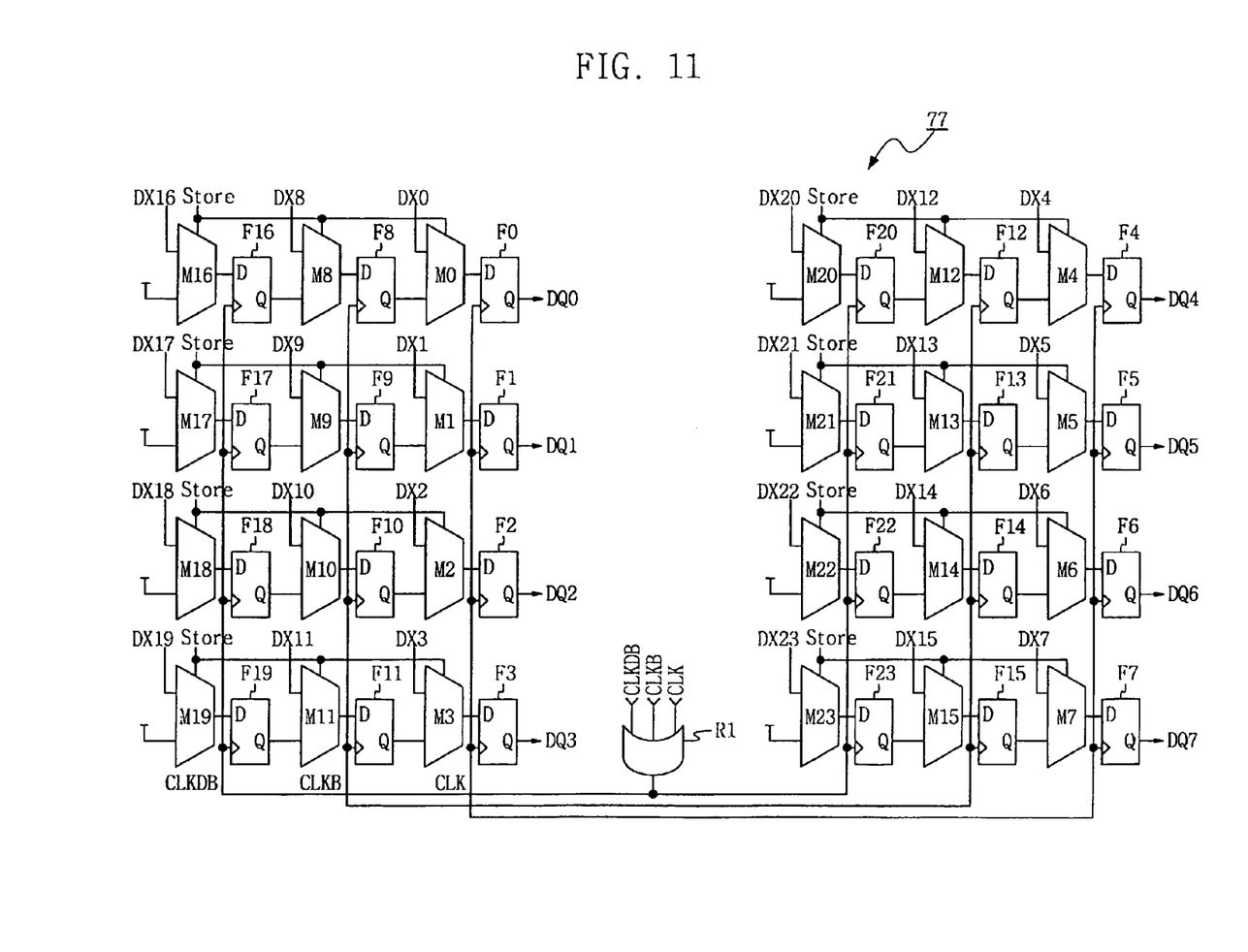
FIG. 11 illustrates an example of a bus width converter shown in FIG. 6.
Figure 12:
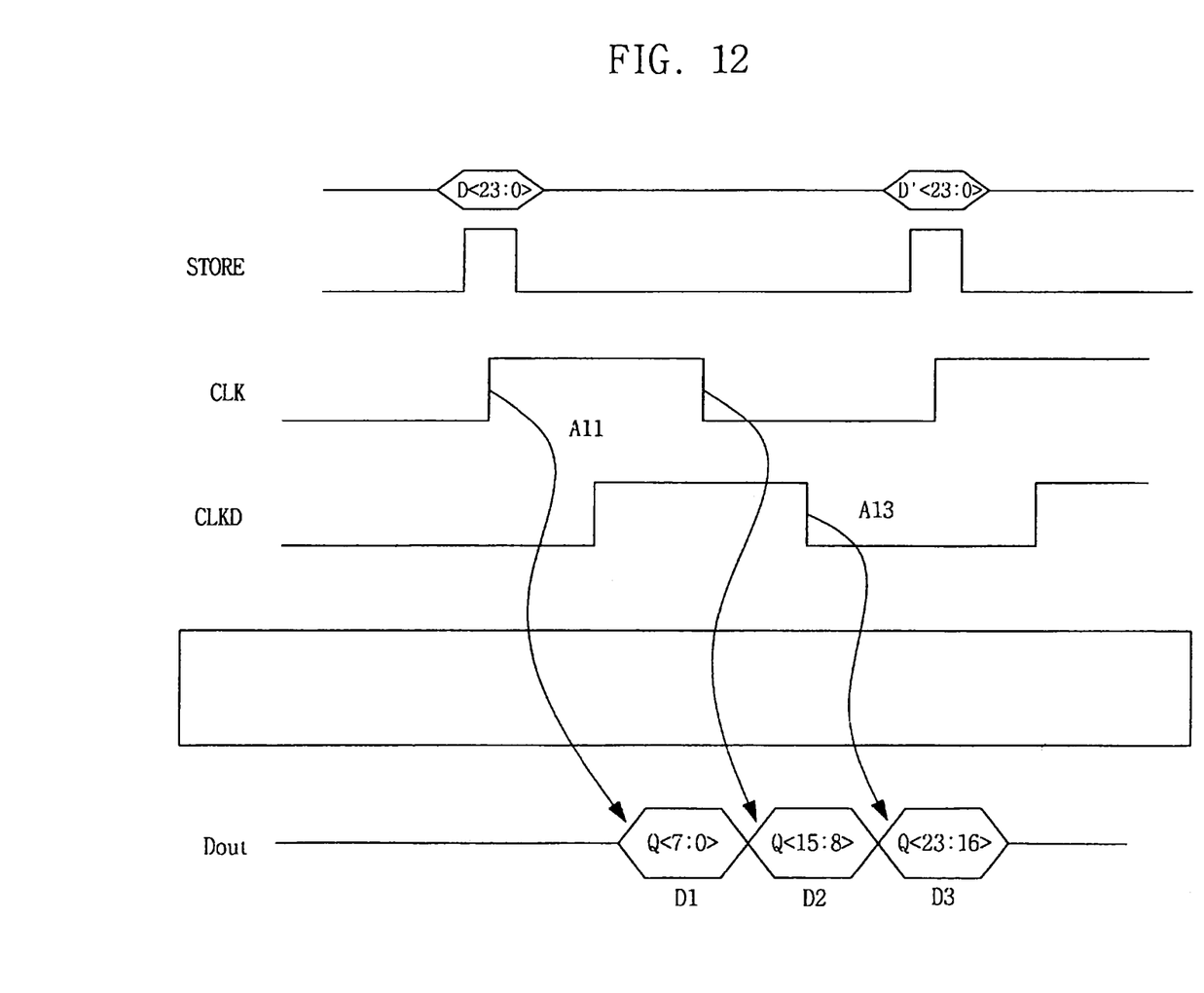
FIG. 12 illustrates example timing diagrams for operation of the bus width converter shown in FIG. 11.

FIG. 11 illustrates an example of bus width converter 77 shown in FIG. 6. FIG. 12 illustrates example timing diagrams for an operation of the bus width converter of FIG. 11.

The bus width converter 77 may include D flip-flops F0~F23, multiplexers M0~M23, and/or a logic OR circuit R1. The bus width converter 77 may have a wiring structure as shown in FIG. 11 and/or as described below.

Operation of the bus width converter 77 is described referring to FIGS. 11 and 12, as follows.

Parallel data D<23:0> of 24 bits may be input through an input terminal DX0-DX23 of the bus width converter 77. For example, the parallel data D<23:0> may be respectively received by the multiplexers M0~M23. A store signal Store may be enabled to load data.

For example, if the store signal Store is enabled to a high level, the multiplexers M0~M23 may each transmit data of 24 bits input through input terminal DX0~DX23 of the bus width converter 77 to each D flip-flop F0~F23. For example, each of the multiplexers M0~M23 may receive the store signal Store. For example, 1 bit data input through a zeroth input terminal DX0 may be input to zeroth D flip-flop F0, and 1 bit data input through an eighth input terminal DX8 may be input to an eighth D flip-flop F8, and 1 bit data input through a sixteenth input terminal DX16 may be input to a sixteenth D flip-flop F16. Accordingly, data of 24 bits input through zeroth to twenty-third input terminals DX0~DX23 may each be input corresponding to zeroth to twenty-third D flip-flop DX0~DX23, for example, data may be loaded. The store signal Store may be disabled to a low level, for example, after the data is loaded.

The multiplexers M0~M23 may transmit data of the input terminal DX0~DX23 if the store signal Store has an enable state of a high level. If the store signal Store has a disable state of a low level, multiplexers DX16~DX23 may transmit a signal of optional level(e.g., a high signal), and the remainder of the multiplexers DX0~DX15 may each transmit an output of the D flip-flops F0~F15.

If clocks CLK, CLKB and CLKDB are enabled, the D flip-flops F0~F23 may operate. For example the logic OR circuit R1 may receive the clocks CLK, CLKB and CLKDB and/or output a result to each of the D flip-flops F0~F23. For example, a burst length may be 3. As illustrated in FIG. 6, the D flip-flops F0~F23 may respond to any one of a rising edge of clock signal CLK, a falling edge of the clock signal CLK (e.g., a rising edge of inverted signal CLKB of the clock signal CLK), and/or a falling edge of delayed clock signal CLKD (e.g., a rising edge of inverted signal CLKDB of the delayed clock signal CLKD, and/or each D flip-flop may output corresponding data.

The D flip-flops F0~F23 may operate in response to a rising edge of the clock signal CLK.

The D flip-flops F0~F23 may output data input through the multiplexers M0~M23 in response to a rising edge of the clock signal CLK. Through output terminal DQ0~DQ7 of the bus width converter 77, data Q<7:0> of 8 bits input through zeroth to seventh input terminals DX0~DX7 may be output as the first data D1 through operation of the D flip-flops F0~F7. Through operation of the D flip-flops F8~F15, data of 8 bits input through eighth to fifteenth input terminals DX8~DX15 may be input to the D flip-flops F0~F7. This operation is valid since the store signal Store has a disable state of a low level.

Through operation of the D flip-flops F16~F23, data of 8 bits input through sixteenth to twenty-third input terminals DX16~DX23 may be input to the D flip-flops F8~F15.

The D flip-flops F0~F23 may operate in response to a falling edge of the clock signal CLK. Data Q<15:8> of 8 bits input through eighth to fifteenth input terminals DX8~DX15 may be output as the second data D2 to output terminal DQ0-DQ7 of the bus width converter 77. The second data D2 may be serially output being successive to the first data D1. Data of 8 bits input through sixteenth to twenty-third input terminals DX16~DX23 may be input to the D flip-flops F0~F7 through operation of the D flip-flops F8-F15. Operation of the D flip-flops F16~F23 may not be pertinent to the description of the second data D2 being serially output and so the description thereof is omitted.

The D flip-flops F0~F23 may operate in response to a falling edge of delayed clock signal CLKD. Data Q<23:16> of 8 bits input through sixteenth to twenty-third input terminals DX16~DX23 may be output as the third data D3 to output terminal DQ0~DQ7 of the bus width converter 77. The third data D3 may be serially output being successive to the second data D2. Operation of the D flip-flops F8~F23 may not be pertinent to the description of the third data D3 being serially output and so the description thereof is omitted.

Although FIGS. 11 and 12 illustrate the operation of the bus width converter 77 is controlled by the store signal Store, the bus width converter 77 may be configured to control operation by a read command READ instead of the store signal Store. Alternatively, the bus width converter 77 may be configured to control the operation by all of the read command READ and the store signal Store.

As described above, if a burst length is 3, data may be divided into 8+8+8 bits, and a bit number of output data may be 8 bits and/or the number of required output pins may be reduced to eight.

As described above, in a parallel bit test circuit and/or parallel bit test method for use in a semiconductor memory device according to example embodiments, the number of output pins used in a parallel bit test may be reduced and the number of chips simultaneously testable in one tester may increase, thereby controlling a test time increase.

As described above, an improved parallel bit test circuit and/or parallel bit test method according to example embodiments may solve a problem of test time increase caused if the number of chips simultaneously testable in a tester is reduced.

If there is a memory capacity increase and/or an increase in the number of input/output lines in a semiconductor memory device, a test time increase of a parallel bit test may be controlled, and for example, if parity bits for an error correction may be added, a test time increase in a parallel bit test may be controlled.

Although example embodiments have been shown and described in this specification and figures, it would be appreciated by those skilled in the art that changes may be made to the illustrated and/or described example embodiments without departing from their principles and spirit.

What is claimed is:

1. A parallel bit test circuit for a semiconductor memory device having a memory cell array in which a plurality of memory cells connected to a plurality of data lines are arrayed in a matrix, the circuit comprising:
    a plurality of data compressors configured to receive data output from the data lines, compress the data, and output the compressed data, each of the plurality of data compressors being coupled with a given number of data lines;
    a delay unit configured to receive a clock signal and, when a burst length is a natural number equal to or more than 2, generate (N−1) number of delayed clock signals from the clock signal; and
    a bus width converter configured to receive the compressed data through M number of input terminals, divide the compressed data into N number of data sets, and sequentially and serially output the N number of data sets through M/N number of output terminals in response to the clock signal and the (N−1) number of delayed clock signals, M being the number of bits of the data output from the data lines.

2. The circuit of claim 1, wherein the burst length is controlled by a burst length control signal.

3. The circuit of claim 1, wherein the semiconductor memory device is a Double Data Rate Synchronous Dynamic Random Access Memory (DDR SDRAM).

4. The circuit of claim 1, wherein the data lately output within each cycle of the clock signal is data of a parity bit area for an error correction.

5. The circuit of claim 1, wherein the bus width converter comprises:
    M number of multiplexers configured to receive the compressed data;
    N number of D flip-flops connected to the M number of multiplexers; and
    an OR gate configured to receive the clock signal and the (N−1) number of delayed clock signal and perform a logical OR operation on the clock signal and the (N−1) number of delayed clock signal,
    the M number of multiplexers and the M number of D flip-flops are arranged in N number of stages,
    when a storage signal applied to the M number of D flip-flops is enabled, the compressed data are loaded from the M number of multiplexers into the M number of D flip-flops, and
    when the storage signal is disabled, in response to the clock signal and the (N−1) number of delayed clock signals, the D flip-flops in each of first to (N−1)-th stages output the loaded compressed data to corresponding multiplexers in the next stage and the D filp-flops in an N-th stage output the loaded compressed data through the M/N number of output terminals.

6. The circuit of claim 1, wherein the delay unit is any one of an inverter chain circuit, a phase locked loop circuit, and a delay locked loop circuit.

7. A parallel bit test method for a semiconductor memory device having a memory cell array in which a plurality of memory cells connected to a plurality of data lines are arrayed in a matrix, the method comprising:
    compressing data from the plurality of data lines and outputting the compressed data;
    when a burst length is a natural number N equal to or more than 2, generating (N−1) number of delayed clock signals from a clock signal; and
    converting the compressed data into output data having a width smaller than that of the compressed data on the basis of the burst length in response to the clock signal and the (N−1) number of delayed clock signal.

8. The method of claim 7, wherein the semiconductor memory device is a Double Data Rate Synchronous Dynamic Random Access Memory (DDR SDRAM).

9. The method of claim 7, wherein the burst length is controlled by a burst length control signal.

10. The method of claim 8, the converting the compressed data comprises:

dividing the compressed data into N number of data sets, N being the same as the burst length; and sequentially and serially outputting the N number of data sets in response to the clock signal and the (N−1) number of delayed clock signals.

11. The method of claim 10, wherein the data set lastly output within each cycle of the clock signal is data of a parity bit area for an error correction.

* * * * *